United States Patent
Kitano

(10) Patent No.: US 10,804,369 B2
(45) Date of Patent: Oct. 13, 2020

(54) SEMICONDUCTOR DEVICE

(71) Applicant: Mitsubishi Electric Corporation, Tokyo (JP)

(72) Inventor: Toshiaki Kitano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,567

(22) PCT Filed: Apr. 28, 2017

(86) PCT No.: PCT/JP2017/017014
§ 371 (c)(1),
(2) Date: Jun. 25, 2019

(87) PCT Pub. No.: WO2018/198337
PCT Pub. Date: Nov. 1, 2018

(65) Prior Publication Data
US 2020/0144393 A1 May 7, 2020

(51) Int. Cl.
*H01L 29/66* (2006.01)
*H01L 29/20* (2006.01)
*H01L 29/812* (2006.01)
*H01L 29/778* (2006.01)

(52) U.S. Cl.
CPC .... *H01L 29/66462* (2013.01); *H01L 29/2003* (2013.01); *H01L 29/778* (2013.01); *H01L 29/812* (2013.01)

(58) Field of Classification Search
CPC ........... H01L 29/2003; H01L 29/66462; H01L 29/778; H01L 29/812
See application file for complete search history.

(56) References Cited

U.S. PATENT DOCUMENTS

| 9,018,634 | B2* | 4/2015 | Tanaka | H01L 29/41725 |
| | | | | 257/194 |
| 10,192,980 | B2* | 1/2019 | Sriram | H01L 29/42376 |
| 2006/0071250 | A1* | 4/2006 | Bude | H01L 29/812 |
| | | | | 257/289 |
| 2006/0124960 | A1 | 6/2006 | Hirose et al. | |
| 2009/0008679 | A1 | 1/2009 | Saito | |
| 2011/0233559 | A1 | 9/2011 | Ishikura | |

(Continued)

FOREIGN PATENT DOCUMENTS

| JP | 2006-196869 A | 7/2006 |
| JP | 2009-009993 A | 1/2009 |

(Continued)

OTHER PUBLICATIONS

WIPO, English Translation of the Written Opinion of the International Searching Authority, Sep. 3, 2019, all pages. (Year: 2019).*

(Continued)

*Primary Examiner* — Victoria K. Hall

(74) *Attorney, Agent, or Firm* — Studebaker & Brackett PC

(57) ABSTRACT

A nitride semiconductor layer (2,3,4) is provided on a Si substrate (1). A gate electrode (5), a source electrode (6) and a drain electrode (7) are provided on the nitride semiconductor layer (2,3,4). A P-type conductive layer (11) in contact with the nitride semiconductor layer (2,3,4) is provided on the Si substrate (1) below the drain electrode (7).

12 Claims, 5 Drawing Sheets

(56) References Cited

U.S. PATENT DOCUMENTS

| | | | |
|---|---|---|---|
| 2012/0153355 A1 | 6/2012 | Umeda et al. | |
| 2013/0076443 A1* | 3/2013 | Yamada | H01L 29/66462 |
| | | | 330/277 |
| 2015/0340485 A1 | 11/2015 | Cheng | |
| 2016/0225889 A1* | 8/2016 | Umeno | H01L 29/2003 |
| 2018/0076287 A1* | 3/2018 | Ohguro | H01L 29/7786 |
| 2018/0269282 A1* | 9/2018 | Yang | H01L 29/36 |

FOREIGN PATENT DOCUMENTS

| | | |
|---|---|---|
| JP | 2011-204984 A | 10/2011 |
| JP | 2013-038250 A | 2/2013 |
| JP | 2015-079923 A | 4/2015 |
| JP | 2016-509756 A | 3/2016 |
| WO | 2011/024440 A1 | 3/2011 |

OTHER PUBLICATIONS

International Search Report; Written Opinion; and Notification of Transmittal of the International Search Report and the Written Opinion of the International Searching Authority, or the Declaration issued in PCT/JP2017/017014; dated Jul. 25, 2017.

Office Action issued in JP 2017-545695; mailed by the Japanese Patent Office dated Sep. 26, 2017.

\* cited by examiner

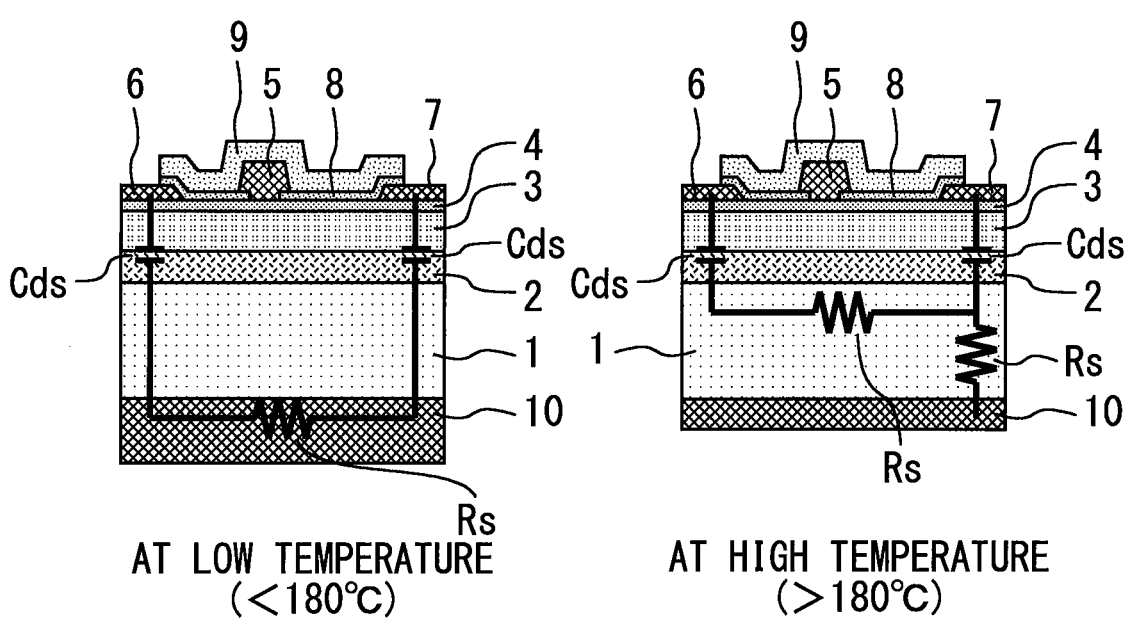

SEMICONDUCTOR DEVICE

FIELD

The present invention relates to a nitride high-electron-mobility transistor (HEMT) formed on a Si substrate).

BACKGROUND

A GaN HEMT having an AlGaN/GaN-based heterostructure has been actively developed because such transistor has a large high-frequency (RF) output density as compared to a GaAs-based HEMT, and the device size, that is, the gate width, can be reduced. For example, when a GaN HEMT having the same power as the GaAs-based HEMT is realized, the drain current can be reduced because the breakdown voltage is large, the transistor size can be reduced, and the interelectrode capacitance can also be reduced. Therefore, the output impedance increases, the power loss due to the series parasitic resistance decreases, the impedance change ratio decreases, and the band becomes wide.

FIG. 7 shows an input/output characteristic of a GaN-on-Si device. At low temperature, the input/output characteristic is normal. However, at high temperature, the output power drops after being saturated from a significantly lower input power than at low temperature. Here, the high temperature is, for example, a condition where the Si substrate temperature exceeds 180° C., and the temperature below that is the low temperature. The Si substrate is cheaper than a SiC substrate, but has the above-described problem.

FIG. 8 shows the resistivity of a high-resistance Si substrate. The resistivity of the Si substrate changes with temperature, and decreases rapidly at a temperature of 180° C. or higher. This is because carriers are generated due to a small band gap of Si. Therefore, the decrease in the output of the GaN-on-Si HEMT at high temperature is due to the decrease in substrate resistance. This is a problem inherent to a Si substrate. In the case of a SiC substrate which has a band gap about three times that of Si, the decrease in resistivity does not occur.

FIG. 9 is a cross-sectional view in which output paths when the resistivity of the Si substrate is high and low are compared with each other in an OFF state, that is, when the channel is pinched off in the RF operation. At low temperature, the substrate resistance Rs is large, and the drain-source capacitance Cds is also small. For this reason, although RF power tries to pass through the path via the back electrode, RF power hardly leaks in this path. Meanwhile, at high temperature, the substrate resistance Rs is lowered to enable easy pass of the RF power, and the drain-source capacitance Cds is rapidly increased by the low resistance of the Si substrate. For this reason, leakage of RF power also increases rapidly, and a phenomenon appears that the output power does not increase even when the input power is increased.

Thus, although the GaN-on-Si HEMT is suitable for low-cost and high-power devices, there is a problem that RF operation at high temperature is unstable. To solve this problem, it has been proposed to divide the drain electrode and isolate the divided portions, so as to reduce the parasitic capacitance with the substrate and improve the RF operation at high temperature (see for example, PTL 1). Also, it has been proposed to divide the drain electrode and embed a low-dielectric layer having a dielectric constant lower than that of GaN between the divided portions, so as to reduce the drain-source capacitance and improve the RF operation at high temperature (see, for example, PTL 2).

CITATION LIST

Patent Literature

[PTL 1] Japanese Patent Application Publication No. 2011-204984
[PTL 2] Japanese Patent Application Publication No. 2015-79923

SUMMARY

Technical Problem

In a GaN-on-Si HEMT, a high-resistance Si substrate is used. When the temperature becomes high, electrons start to be accumulated in the Si substrate at the boundary between the nitride semiconductor and the Si substrate under the drain electrode. This becomes a leak path of the RF power, and the leaked power further generates heat, thereby initiating a cycle in which the resistivity of the Si substrate is lowered. As a result, the drain-source capacitance rapidly increases and the output power decreases. Therefore, when using a GaN-on-Si HEMT as an RF high-power device, even if the input power is increased at high temperature, the output power is saturated and decreases at an early stage.

With the conventional technique of dividing a drain electrode and isolating the divided portions, it is difficult to reduce the parasitic capacitance between the drain electrode and the Si substrate and it is difficult to prevent the decrease in resistivity. In addition, with the conventional technique of dividing a drain electrode and embedding a low-dielectric layer between the divided portions, it is difficult to prevent the decrease in the resistivity of the Si substrate.

The present invention has been made to solve the problems as described above, and an object thereof is to obtain a semiconductor device making it possible to improve high-frequency characteristics at high temperature.

Solution to Problem

A semiconductor device according to the present invention includes: a Si substrate; a nitride semiconductor layer provided on the Si substrate; a gate electrode, a source electrode and a drain electrode provided on the nitride semiconductor layer; and a P-type conductive layer in contact with the nitride semiconductor layer and provided on the Si substrate below the drain electrode.

Advantageous Effects of Invention

In the present invention, the P-type conductive layer is provided below the drain electrode. For this reason, electrons generated in the Si substrate at high temperature can be prevented from being accumulated under the drain electrode. Therefore, there are no electrons that leak high-frequency power, and it is possible to prevent high frequency power from leaking to the substrate side in the OFF state. As a consequence, the decrease in output power at high temperature is eliminated, and high-frequency characteristics at high temperature can be improved.

BRIEF DESCRIPTION OF THE DRAWINGS

FIG. 9 is a cross-sectional view in which output paths when the resistivity of the Si substrate is high and low are compared with each other in an OFF state, that is, when the channel is pinched off in the RF operation.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
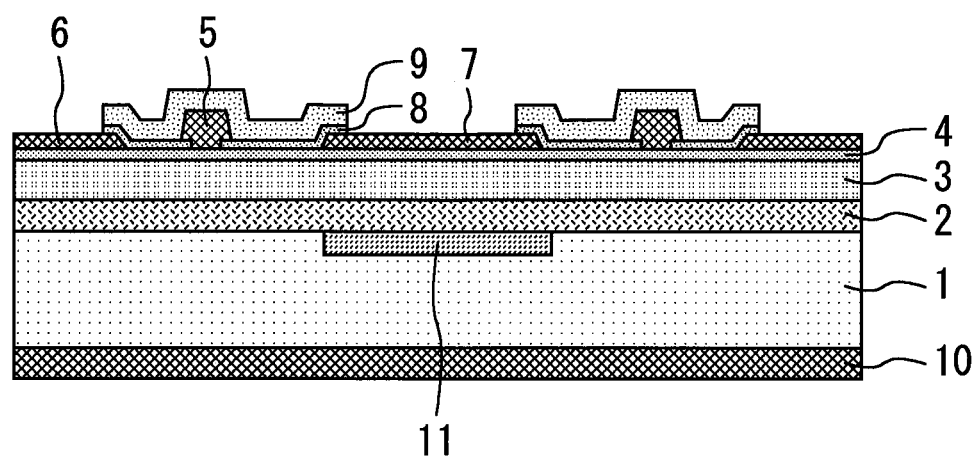
FIG. 1 is a cross-sectional view showing a semiconductor device according to Embodiment 1 of the present invention.

FIG. 1 is a cross-sectional view showing a semiconductor device according to Embodiment 1 of the present invention. This semiconductor device is a GaN-on-Si HEMT. A Si substrate 1 is, for example, a high-resistance Si substrate having a resistance of about 10000 Ω·cm at room temperature.

A buffer layer 2, an electron transit layer 3 and an electron supply layer 4 are provided by crystal growth as nitride semiconductor layers on the Si substrate 1. The buffer layer 2 is formed, for example, by laminating a plurality of AlGaN layers having different Al concentrations. The electron transit layer 3 is, for example, a non-doped GaN layer. The electron supply layer 4 is, for example, an AlGaN layer having an Al composition of 0.1 to 0.5, or an AlN layer formed between the AlGaN layer and the electron transit layer 3.

A gate electrode 5, a source electrode 6 and a drain electrode 7 are provided on the electron supply layer 4. The gate electrode 5 is made of, for example, a Ni/Au-based material. The source electrode 6 and the drain electrode 7 are made of, for example, a Ti/Al-based material. A lower insulating film 8 and an upper insulating film 9 are provided to protect these electrodes. The lower insulating film 8 and the upper insulating film 9 are, for example, silicon nitride films. A back electrode 10 is provided on the back surface of the Si substrate 1. The back electrode 10 is made of, for example, a Ti/Au-based material.

A P-type conductive layer 11 in contact with the buffer layer 2 is provided on the Si substrate 1 below the drain electrode 7. The P-type conductive layer 11 is formed, for example, by ion implantation, and boron (B), aluminum (Al) or the like is used as a P-type dopant. The impurity concentration of the P-type conductive layer 11 is preferably 5E16 cm$^{-3}$ or more. The implantation depth of the P-type conductive layer 11 may be 1 micron or less.

When a GaN-on-Si HEMT is used as a high frequency device, a high-resistance Si substrate 1 is used to prevent the RF power from leaking to the substrate side and causing the deterioration of the output characteristic. However, at high temperature, the generation of carriers starts in the Si substrate 1. Further, in the GaN-on-Si HEMT, high-voltage operation is performed to take advantage of the characteristics of the GaN-based material. For example, about 50 V is usually used as the drain voltage. Since the drain voltage is high, electrons among the carriers generated in the Si substrate 1 are concentrated under the drain electrode 7 on the Si substrate 1 side that is in contact with the buffer layer 2.

By contrast, in the present embodiment, the P-type conductive layer 11 is provided below the drain electrode 7. For this reason, electrons generated in the Si substrate 1 at high temperature can be prevented from being accumulated under the drain electrode 7. Therefore, there are not any electrons that leak high-frequency power, and it is possible to prevent high frequency power from leaking to the substrate side in the OFF state. As a consequence, the decrease in output power at high temperature is eliminated, and high-frequency characteristics at high temperature can be improved. As a result, it is possible to realize a GaN-on-Si HEMT capable of operating at a higher temperature than the conventional transistors.

However, when the P-type conductive layer 11 is formed on the entire surface of the Si substrate 1 including the regions under the gate electrode 5 and the source electrode 6, although the output decrease at high temperature can be suppressed, the RF power leaks via the P-type conductive layer 11 at low temperature. Further, since the source electrode 6 has the same voltage as the back surface electrode 10, even if the P-type conductive layer 11 is formed under the source electrode 6, electrons are less likely to accumulate therein as compared to under the drain electrode 7, and no effect is demonstrated. Therefore, the P-type conductive layer 11 is not provided below the gate electrode 5 and the source electrode 6.

Embodiment 2

Figure 2:
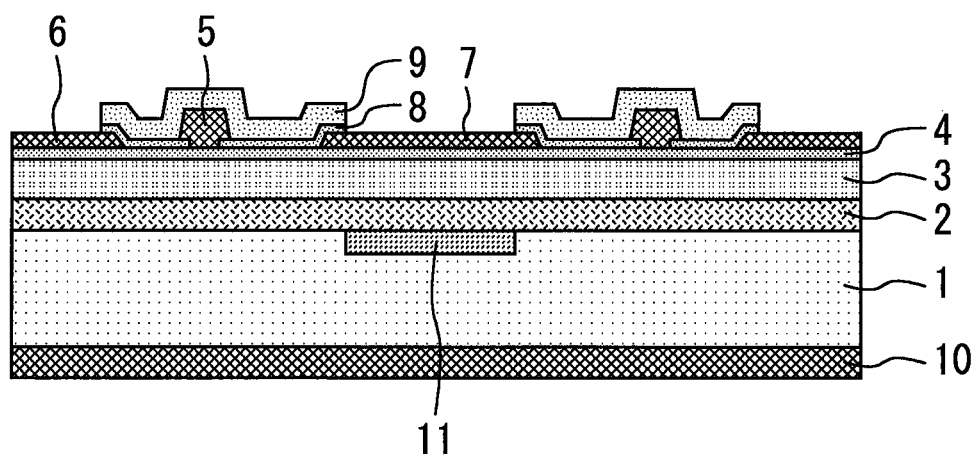
FIG. 2 is a cross-sectional view showing a semiconductor device according to Embodiment 2 of the present invention.

FIG. 2 is a cross-sectional view showing a semiconductor device according to Embodiment 2 of the present invention. When the P-type conductive layer 11 is provided, leakage of high-frequency power may increase at low temperature. Meanwhile, in the present embodiment, the width of the P-type conductive layer 11 is smaller than the width of the drain electrode 7. As a result, leakage of high-frequency power to the substrate at low temperature can be reduced, and the characteristics at low temperature can be improved. Other features and effects are the same as in Embodiment 1.

Embodiment 3

Figure 3:
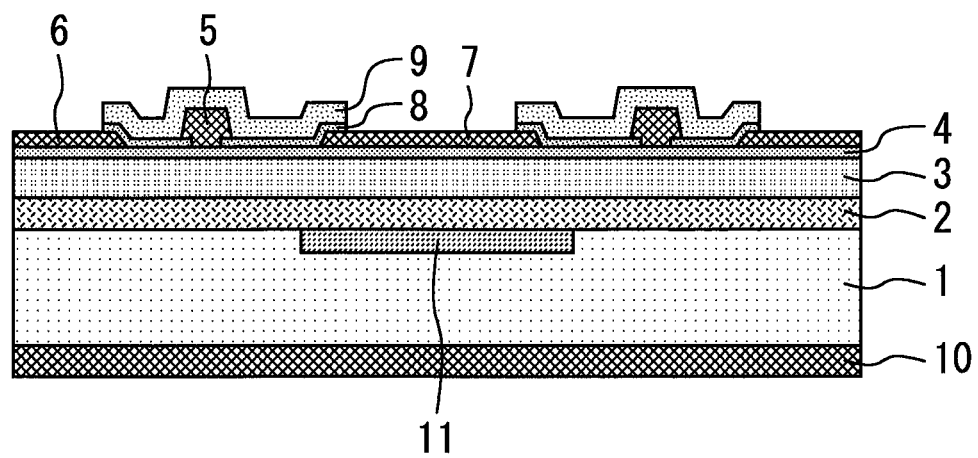
FIG. 3 is a cross-sectional view showing a semiconductor device according to Embodiment 3 of the present invention.

FIG. 3 is a cross-sectional view showing a semiconductor device according to Embodiment 3 of the present invention. The width of the P-type conductive layer 11 is larger than the width of the drain electrode 7. As a result, leakage of high-frequency power to the substrate side at high temperature can be reduced as compared with Embodiment 1. Other features and effects are the same as in Embodiment 1. When the width of the P-type conductive layer 11 is increased, leakage of high-frequency power is increased at low temperature. However, this embodiment is effective when the characteristics at high temperature are considered important.

Embodiment 4

Figure 4:
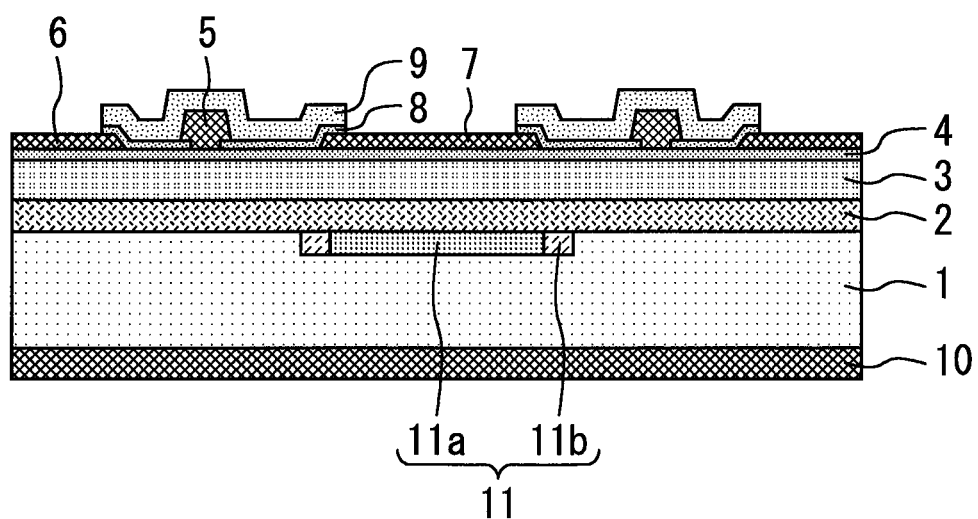
FIG. 4 is a cross-sectional view showing a semiconductor device according Embodiment 4 of the present invention.

FIG. 4 is a cross-sectional view showing a semiconductor device according Embodiment 4 of the present invention. The P-type conductive layer 11 has a high-concentration layer 11a and a low-concentration layer 11b provided outside the high-concentration layer 11a and having an impurity concentration lower than that of the high-concentration layer 11a. The high-concentration layer 11a and the low-concentration layer 11b are formed, for example, by ion implantation, and boron (B), aluminum (Al) or the like is used as a P-type dopant.

When the width of the P-type conductive layer 11 is increased as in Embodiment 3, leakage of high-frequency power is increased at low temperature. By contrast, when the high-concentration layer 11a and the low-concentration layer 11b are provided as in the present embodiment, it is easy to achieve both the characteristics at high temperature and the characteristics at low temperature. That is, it is easy to adjust the characteristics at low temperature while preventing the electrons generated in the Si substrate 1 at high temperature from being accumulated under the drain electrode 7. As a result, the adjustment can be made to the state optimal for the purpose of a device. Other features and effects are the same as in Embodiment 1.

Embodiment 5

Figure 5:
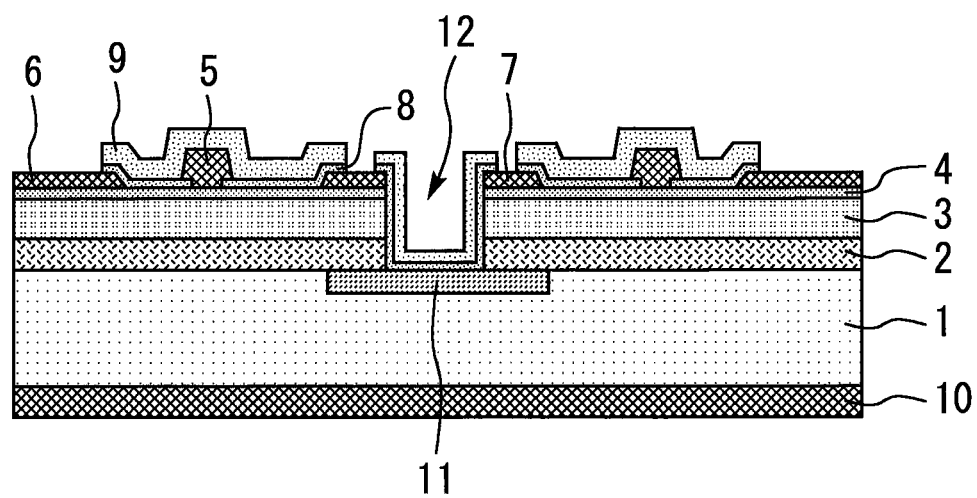
FIG. 5 is a cross-sectional view showing a semiconductor device according Embodiment 5 of the present invention.

FIG. 5 is a cross-sectional view showing a semiconductor device according Embodiment 5 of the present invention. The drain electrode 7 is divided on the P-type conductive layer 11, and a cavity 12 is provided in the buffer layer 2, the electron transit layer 3 and the electron supply layer 4. For example, the buffer layer 2, the electron transit layer 3 and the electron supply layer 4 are dry etched using a chlorine-based gas to form the cavity 12 so that the Si substrate 1 is exposed. As a result, since the drain-source capacitance can be reduced, the high-frequency power is less likely to leak to the substrate side at high temperature.

Embodiment 6

Figure 6:
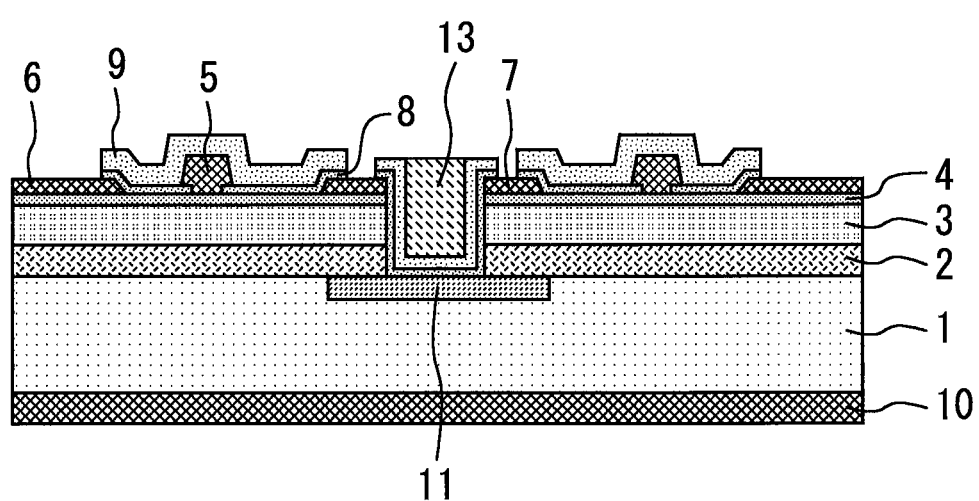
FIG. 6 is a cross-sectional view showing a semiconductor device according to Embodiment 6 of the present invention.
Figure 7:
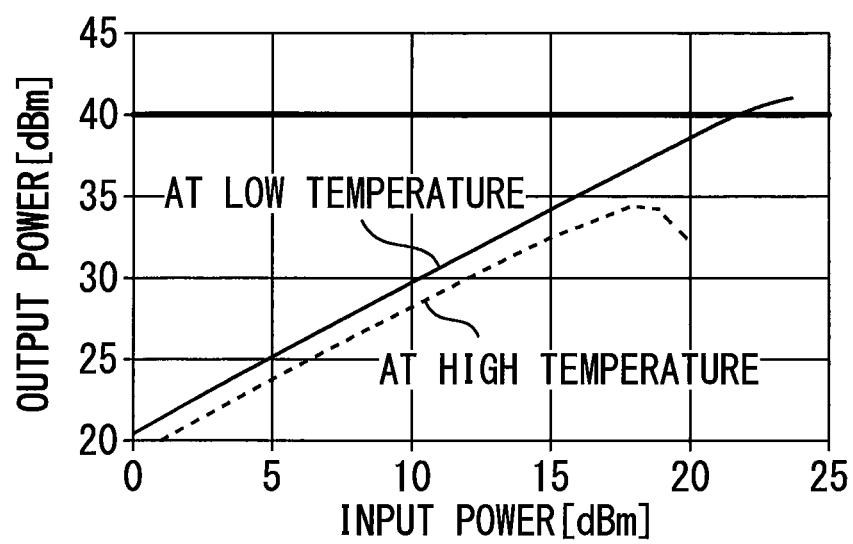
FIG. 7 shows an input/output characteristic of a GaN-on-Si device.
Figure 8:
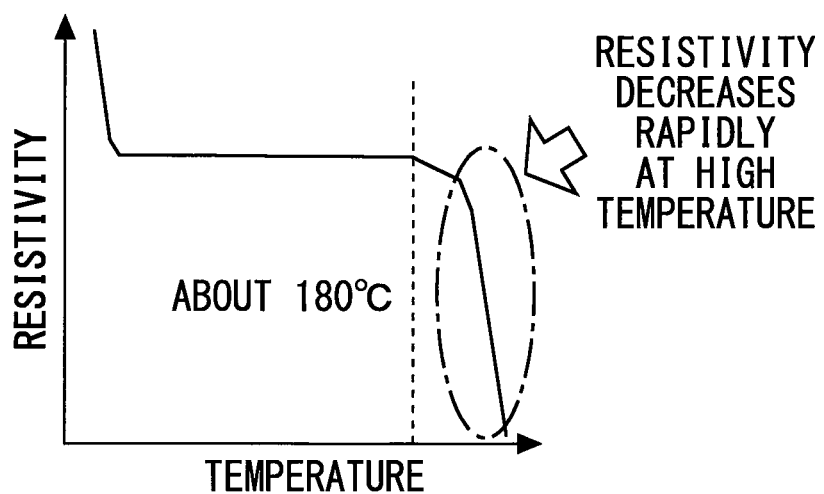
FIG. 8 shows the resistivity of a high-resistance Si substrate.

FIG. 6 is a cross-sectional view showing a semiconductor device according to Embodiment 6 of the present invention. A low-dielectric-constant material 13 having a dielectric constant lower than dielectric constants of the buffer layer 2, the electron transit layer 3 and the electron supply layer 4 is embedded in the cavity 12. The low-dielectric-constant material 13 is, for example, benzocyclobutene, a polyimide, a polyfluorocarbon or the like. As a result, since the drain-source capacitance can be reduced, the high-frequency power is less likely to leak to the substrate side at high temperature. In the case of a device sealed with a mold resin, in Embodiment 5, since the mold resin having a somewhat high dielectric constant enters the cavity 12, the effect is reduced. By contrast, in the present embodiment in which the low-dielectric-constant material 13 having a dielectric constant lower than that of the mold resin is embedded in the cavity 12, this can be prevented.

REFERENCE SIGNS LIST

1 Si substrate; 2 buffer layer (nitride semiconductor layer); 3 electron transit layer (nitride semiconductor layer); 4 electron supply layer (nitride semiconductor layer); 5 gate electrode; 6 source electrode; 7 drain electrode; 11 P-type conductive layer; 11a high-concentration layer; 11b low-concentration layer; 12 cavity; 13 low-dielectric-constant material

The invention claimed is:
1. A semiconductor device comprising:
a high-resistance Si substrate;
a nitride semiconductor layer provided on the high-resistance Si substrate;
a gate electrode, a source electrode and a drain electrode provided on the nitride semiconductor layer; and
a P-type conductive layer in contact with the nitride semiconductor layer and provided on the high-resistance Si substrate below the drain electrode,
wherein the P-type conductive layer is not provided below the gate electrode and the source electrode.

2. The semiconductor device according to claim 1, wherein a width of the P-type conductive layer is smaller than a width of the drain electrode.

3. The semiconductor device according to claim 1, wherein a width of the P-type conductive layer is larger than a width of the drain electrode.

4. A semiconductor device comprising:
a Si substrate;
a nitride semiconductor layer provided on the Si substrate;
a gate electrode, a source electrode and a drain electrode provided on the nitride semiconductor layer; and
a P-type conductive layer in contact with the nitride semiconductor layer and provided on the Si substrate below the drain electrode,
wherein the P-type conductive layer is not provided below the gate electrode and the source electrode, and
the P-type conductive layer has a high-concentration layer and a low-concentration layer provided outside the high-concentration layer and having an impurity concentration lower than an impurity concentration of the high-concentration layer.

5. The semiconductor device according to claim 4, wherein a width of the P-type conductive layer is smaller than a width of the drain electrode.

6. The semiconductor device according to claim 4, wherein a width of the P-type conductive layer is larger than a width of the drain electrode.

7. A semiconductor device comprising:
a Si substrate;
a nitride semiconductor layer provided on the Si substrate;
a gate electrode, a source electrode and a drain electrode provided on the nitride semiconductor layer; and
a P-type conductive layer in contact with the nitride semiconductor layer and provided on the Si substrate below the drain electrode,
wherein the P-type conductive layer is not provided below the gate electrode and the source electrode, and
a cavity is provided in the nitride semiconductor layer on the P-type conductive layer.

8. The semiconductor device according to claim 7, further comprising a low-dielectric-constant material having a dielectric constant lower than a dielectric constant of the nitride semiconductor layer embedded in the cavity.

9. The semiconductor device according to claim 8, wherein a width of the P-type conductive layer is smaller than a width of the drain electrode.

10. The semiconductor device according to claim 8, wherein a width of the P-type conductive layer is larger than a width of the drain electrode.

11. The semiconductor device according to claim 7, wherein a width of the P-type conductive layer is smaller than a width of the drain electrode.

12. The semiconductor device according to claim 7, wherein a width of the P-type conductive layer is larger than a width of the drain electrode.

* * * * *